United States Patent
Seder et al.

(10) Patent No.: US 11,480,789 B2
(45) Date of Patent: Oct. 25, 2022

(54) SPECKLE-REDUCED DIRECT-RETINA HOLOGRAPHIC PROJECTOR INCLUDING MULTIPLE SPATIAL LIGHT MODULATORS

(71) Applicant: GM GLOBAL TECHNOLOGY OPERATIONS LLC, Detroit, MI (US)

(72) Inventors: Thomas A. Seder, Fraser, MI (US); Kai-Han Chang, Madison Heights, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 17/004,249

(22) Filed: Aug. 27, 2020

(65) Prior Publication Data
US 2022/0066211 A1    Mar. 3, 2022

(51) Int. Cl.
*G02B 27/01*        (2006.01)
*G02B 26/08*        (2006.01)
(Continued)

(52) U.S. Cl.
CPC .......... *G02B 27/0103* (2013.01); *B60K 35/00* (2013.01); *G02B 26/0833* (2013.01);
(Continued)

(58) Field of Classification Search
CPC ............ G02B 27/0103; G02B 26/0833; G02B 27/48; G09G 3/001; G09G 2354/00; G09G 2380/10; G02F 1/13306; G02F 1/135; G02F 2203/12; B60K 35/00; B60K 2370/1529; B60K 2370/29; B60K 2370/23; G03H 2225/32; G03H 2225/60; G03H 1/32; G03H 1/10; G03H 1/2294; G03H 1/16; G03H 2225/22; G03H 2225/24; G01N 2021/479; G03F 7/70583
See application file for complete search history.

(56) References Cited

U.S. PATENT DOCUMENTS

| 7,551,341 B1 * | 6/2009 | Ward ................... G03B 21/005 359/259 |
| 10,302,937 B2 | 5/2019 | Ferris et al. |

(Continued)

OTHER PUBLICATIONS

U.S. Appl. No. 16/363,536, filed Mar. 25, 2019, Chang et al.
(Continued)

*Primary Examiner* — Douglas M Wilson

(57) ABSTRACT

A direct-retina holographic projection system includes first and second spatial light modulators (SLMs) and a control module. The first SLM receives a beam of light and dithers the beam of light at a predetermined frequency to provide multiple instances of the beam of light. The second SLM receives the instances of the beam of light, displays an encoded phase hologram of a graphic image to be projected, and diffracts the instances of the beam of light to provide instances of the encoded phase hologram with the same graphic image but multiplied with dithered wavefronts. The control module: iteratively adjusts a parameter of the first SLM to generate the instances of the beam of light; and controls operation of the second SLM to, based on the instances of the beam of light, display multiple instances of the graphic image on a retina of an eye of a viewer.

19 Claims, 8 Drawing Sheets

(51) Int. Cl.
  *G02F 1/135* (2006.01)
  *G02F 1/133* (2006.01)
  *B60K 35/00* (2006.01)
  *G09G 3/00* (2006.01)
  *G03H 1/22* (2006.01)
  *G03H 1/32* (2006.01)
  *G03F 7/20* (2006.01)
  *G01N 21/47* (2006.01)
  *G03H 1/16* (2006.01)
  *G02B 27/48* (2006.01)

(52) U.S. Cl.
  CPC .......... *G02F 1/135* (2013.01); *G02F 1/13306* (2013.01); *G09G 3/001* (2013.01); *B60K 2370/1529* (2019.05); *B60K 2370/23* (2019.05); *B60K 2370/29* (2019.05); *G01N 2021/479* (2013.01); *G02B 27/48* (2013.01); *G02F 2203/12* (2013.01); *G03F 7/70583* (2013.01); *G03H 1/16* (2013.01); *G03H 1/2294* (2013.01); *G03H 1/32* (2013.01); *G03H 2225/22* (2013.01); *G03H 2225/24* (2013.01); *G03H 2225/32* (2013.01); *G03H 2225/60* (2013.01); *G09G 2354/00* (2013.01); *G09G 2380/10* (2013.01)

(56) References Cited

U.S. PATENT DOCUMENTS

| | | | |
|---|---|---|---|
| 10,747,314 B1 | 8/2020 | Chang et al. | |
| 2005/0225833 A1* | 10/2005 | Marshall | G09G 3/346 |
| | | | 359/291 |
| 2008/0204834 A1* | 8/2008 | Hill | G06Q 30/0601 |
| | | | 359/9 |
| 2009/0185251 A1* | 7/2009 | Chen | H04N 9/3161 |
| | | | 359/199.3 |
| 2011/0157667 A1* | 6/2011 | Lacoste | G03H 1/0808 |
| | | | 359/9 |
| 2012/0008181 A1* | 1/2012 | Cable | G03H 1/2294 |
| | | | 359/9 |
| 2016/0109701 A1 | 4/2016 | Goldman-Shenhar et al. | |
| 2017/0161949 A1 | 6/2017 | Seder et al. | |
| 2017/0161950 A1 | 6/2017 | Seder et al. | |
| 2018/0052276 A1* | 2/2018 | Klienman | G02B 5/3025 |
| 2020/0073138 A1 | 3/2020 | Chang | |
| 2020/0073139 A1 | 3/2020 | Chang | |
| 2021/0144347 A1* | 5/2021 | Takashima | G03B 21/008 |
| 2021/0181519 A1* | 6/2021 | Uhlendorf | G02B 27/141 |

OTHER PUBLICATIONS

U.S. Appl. No. 16/379,439, filed Apr. 9, 2019, Chang et al.
U.S. Appl. No. 16/418,574, filed May 21, 2019, Chang et al.
U.S. Appl. No. 16/459,994, filed Jul. 2, 2019, Seder et al.
U.S. Appl. No. 16/531,744, filed Aug. 5, 2019, Chang et al.
U.S. Appl. No. 16/531,844, filed Aug. 5, 2019, Chang et al.
U.S. Appl. No. 16/549,606, filed Aug. 23, 2019, Chang et al.
U.S. Appl. No. 16/553,475, filed Aug. 28, 2019, Chang et al.
U.S. Appl. No. 16/560,035, filed Sep. 4, 2019, Chang et al.
U.S. Appl. No. 16/599,777, filed Oct. 11, 2019, Chang et al.
U.S. Appl. No. 16/661,227, filed Oct. 23, 2019, Chang et al.
U.S. Appl. No. 16/676,213, filed Nov. 6, 2019, Harden et al.
U.S. Appl. No. 16/688,139, filed Nov. 19, 2019, Wells et al.
U.S. Appl. No. 16/711,271, filed Dec. 11, 2019, Chang et al.
U.S. Appl. No. 16/782,856, filed Feb. 5, 2020, Harden Jr. et al.

* cited by examiner

SPECKLE-REDUCED DIRECT-RETINA HOLOGRAPHIC PROJECTOR INCLUDING MULTIPLE SPATIAL LIGHT MODULATORS

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to direct-retina projection holographic display systems and head up display systems of vehicles.

Display devices are used in a variety of applications. Some example display devices are flat panel displays, projection displays, and head-up displays. Display devices can be either be of a transmission or reflection type.

A driver of a vehicle traditionally views surroundings of a vehicle through windows, windshields, and other glass of the vehicle. The driver may control vehicle acceleration, deceleration, and steering based on the driver's visual observation of the surroundings of the vehicle. The vehicle may include one or more displays that display various information to the driver. For example, some vehicles include an infotainment system that includes a display that displays various infotainment and other vehicle information. The vehicle may also include a head-up display (HUD) that displays information by forming a virtual image at a certain distance with reflection of a windshield. For example, the HUD may display a vehicle speed and other vehicle information (e.g., warnings such as lane departure warnings and collision avoidance warnings).

SUMMARY

A direct-retina holographic projection system is provided and includes a first spatial light modulator, a second spatial light modulator, and a control module. The first spatial light modulator is configured to receive a beam of light from a light source and dither the beam of light at a predetermined frequency to provide multiple instances of the beam of light. The second spatial light modulator is configured to receive the instances of the beam of light from the first spatial light modulator, display an encoded phase hologram of a graphic image to be projected, and diffract the instances of the beam of light to provide instances of the encoded phase hologram with same graphic information as the graphic image but multiplied with dithered wavefronts. The control module is configured to: iteratively adjust a parameter of the first spatial light module to generate the instances of the beam of light; and control operation of the second spatial light modulator to, based on the instances of the beam of light, display multiple instances of the graphic image on a retina of an eye of a viewer by directing the instances of the encoded phase hologram of the graphic image toward a reflector or the eye of the viewer.

In other features, the second spatial light modulator directs the instances of the encoded phase hologram directly at the eye of the viewer without forming a real image on a diffuser and without reflecting the image with mirrors.

In other features, the second spatial light modulator directs the instances of the encoded phase hologram directly at the reflector to be seen by the eye of the viewer without forming a real image on a diffuser. The reflector is a windshield of a vehicle.

In other features, the control module is configured to dither the beam of light, via the first spatial light modulator, at a frequency greater than or equal to 60 Hertz.

In other features, the control module is configured to dither the beam of light between a first angle and a second angle at the predetermined frequency.

In other features, a difference between the first angle and the second angle is less than or equal to 5°.

In other features, a difference between the first angle and the second angle is less than or equal to 1°.

In other features, the first spatial light modulator includes digital light processing microelectromechanical systems mirrors.

In other features, the first spatial light modulator includes a piston mode spatial light modulator.

In other features, the first spatial light modulator includes a ferroelectric liquid crystal spatial light modulator.

In other features, the direct-retina holographic projection system further includes a device driver. The control module is configured to control the device driver to generate one or more driving voltages. The first spatial light modulator changes a dithering angle based on the driving voltages.

In other features, a method of operating direct-retina holographic projection system is provided. The method includes: receiving a beam of light from a light source at a first spatial light modulator; dithering the beam of light at a predetermined frequency to provide multiple instances of the beam of light, where the dithering includes iteratively adjusting a parameter of the first spatial light module to generate the instances of the beam of light; receiving the instances of the beam of light at a second spatial light modulator; converting the instances of the beam of light to multiple instances of an encoded phase hologram; and controlling operation of the second spatial light modulator to, based on the instances of the beam of light, display multiple instances of an image on a retina of an eye of a viewer by directing the instances of the encoded phase hologram toward a reflector or the eye of the viewer.

In other features, the method further includes directing the instances of the encoded phase hologram directly from the second spatial light modulator to the reflector or the eye of the viewer.

In other features, the beam of light is dithered, via the first spatial light modulator, at a frequency greater than or equal to 60 Hertz.

In other features, the beam of light is dithered, via the first spatial light modulator, between a first angle and a second angle at the predetermined frequency.

In other features, a difference between the first angle and the second angle is less than or equal to 5°.

In other features, a difference between the first angle and the second angle is less than or equal to 5°.

In other features, the dithering of the beam of light includes changing driving voltages of digital light processing microelectromechanical systems mirrors of the first spatial light modulator.

In other features, the dithering of the beam of light includes changing a driving voltage of a piston mode spatial light modulator.

In other features, the dithering of the beam of light includes changing a driving voltage of a ferroelectric liquid crystal spatial light modulator.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

A vehicle may include a holographic HUD that includes a SLM and a coherent or partially coherent light source. The phase hologram is encoded on a SLM. Light from a coherent or partially coherent light source illuminates the SLM that is encoded with a phase hologram and the light is diffracted in a manner prescribed by the hologram. The diffracted light is reflected by a windshield of the vehicle and forms a real image on a driver's retina.

Display systems often employ a source of coherent light, such as a laser, in conjunction with the other display components. Coherent light may refer to light that is spatially and temporally in-phase. A large amount of "speckle" can arise when coherent light is reflected off a diffused surface. When coherent light is reflected from a diffused surface, various points on the surface each emit a light wave. Typically, the reflected light waves have a same frequency, but the phase of the light reflected from different points on the surface can vary resulting in granular, non-uniform intensity due to quasi-random interference. The reflected light interferes constructively and destructively to produce a random pattern of light and dark spots or bands. The overall non-uniform pattern is referred to as "speckle". When forming an image from the reflected light, the speckles add noise to an image.

Some holographic projection systems reduce speckle by vibrating one or more diffusers or by including and operating an active diffuser, such as a vibrating projection screen. These types of holographic projection systems do not directly project a phase hologram at retinas of a person viewing the generated images without first reflecting the light off a diffuser.

In a direct-retina projection holographic display system, a projected phase hologram is directed to the eyes of a viewer without being reflected off a diffuser. Although removal of a diffuser reduces the amount of speckle in a holographic display system, some speckle can still arise due to reflection of light off, for example, one or more other surfaces. The examples set forth herein include direct-retina projection holographic display systems that do not include a diffuser and are configured to reduce and/or eliminate the amount of speckle. The direct-retina projection holographic display systems include multiple spatial light modulators (SLMs) including a fast-switching SLM for dithering and a second SLM for hologram generation. The second SLM may be liquid crystal on silicon (LCoS). The fast-switching SLM performs as a light dithering SLM that dithers a light beam between predetermined angles and at a high-frequency (e.g., greater than or equal to 60 Hertz (Hz)). This dithering is provided prior to generation of an encoded hologram by the LCoS SLM, which reduces speckle and/or blurring of images as seen by the viewer.

Figure 1:
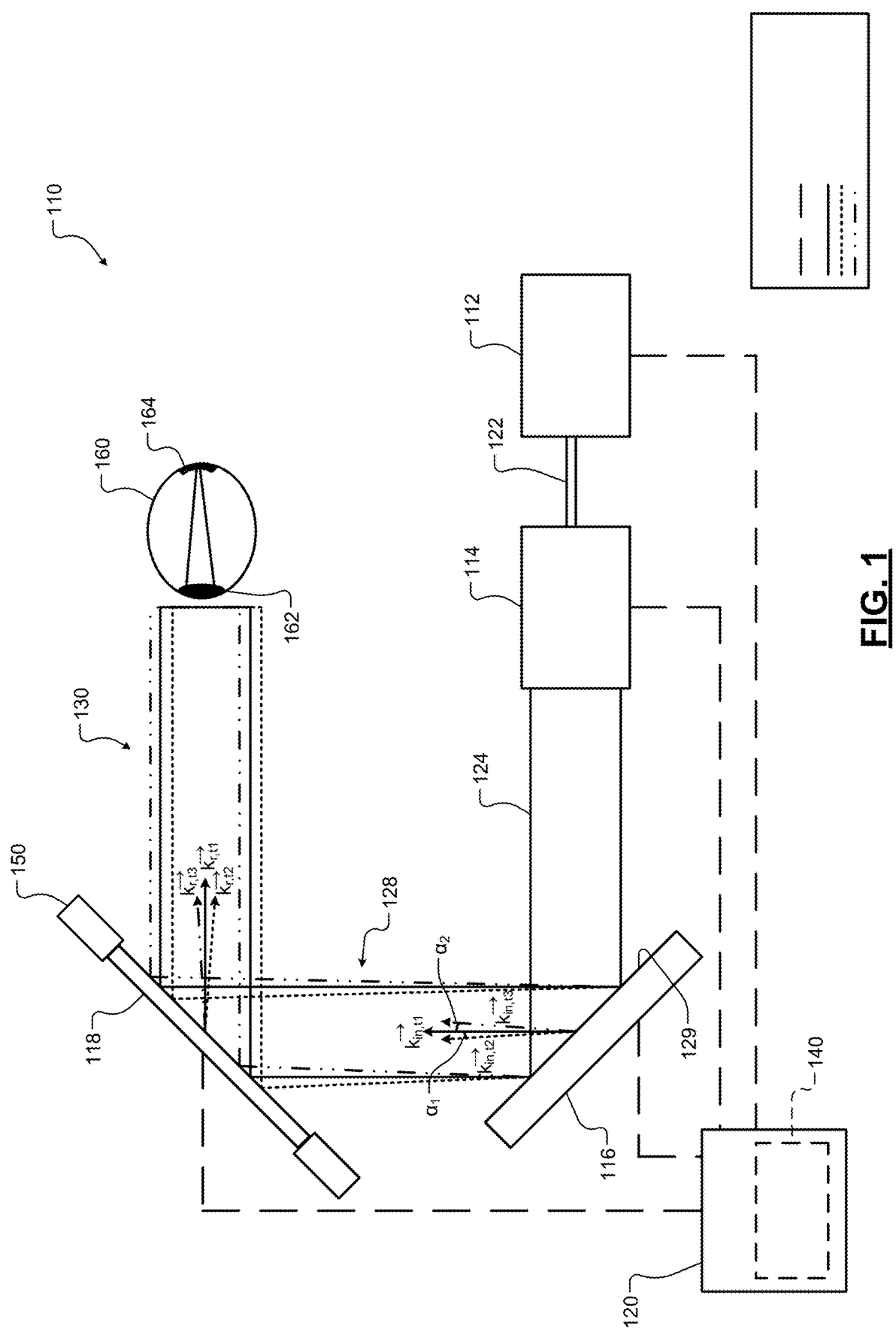
FIG. 1 is a function block diagram of an example of a direct-retina holographic projection system in accordance with the present disclosure.

FIG. 1 shows an example of a direct-retina holographic projection system 110 that includes one or more light (or laser) sources (one laser 112 is shown), a beam expander 114, a switching (or first) SLM 116, a LCoS (or second) SLM 118 and a control module 120. The laser 112 generates a laser beam 122, which is received at the beam expander 114. The beam expander 114 expands a width of the laser beam 122 to provide an expanded beam 124.

The switching SLM 116 receives the expanded beam 124 and iteratively changes an incident angle of the expanded beam 124 reflected at the LCoS SLM 118 to provide a dithered expanded beam 128. Although primarily referred to herein as a LCoS SLM, the second SLM 118 may be replaced with a different type of SLM. The dithered expanded beam 128 includes multiple instances of the expanded beam 124. The control module 120 switches angular states and/or mirror heights of the switching SLM 116 to change the incident angle of the expanded beam 124 at a high-frequency (e.g., greater than or equal to 60 Hz). The expanded beam 124 is dithered to provide multiple beams at respective incident angles referred to as the dithered expanded beam 128. The dithered expanded beam 128 may be viewed as multiple light sources that illuminate the LCoS SLM 118 at slightly different incident angles.

Example incident vectors $\vec{k}_{in,t1}$, $\vec{k}_{in,t2}$, $\vec{k}_{in,t3}$ for three different occurrences of the same beam (or three beams) at three different times are shown to illustrate changes in the incident angle of the expanded beam 124. The angle of the vector $\vec{k}_{in,t1}$ is at an acute predetermined angle (e.g., 45°) relative to, for example, a front surface 129 of the switching SLM 116. The angles of the vectors $\vec{k}_{in,t2}$, $\vec{k}_{in,t3}$ relative to the angle of the vector $\vec{k}_{in,t1}$ are represented as $\alpha_1$ and $\alpha_2$, respectively. The angle $\alpha_2$ may be equal and an inverse of angle $\alpha_1$. For example, $\alpha_2$ may be −1° and a1 may be 1°. As another example, the expanded beam 124 may be dithered ±2.5° from a reference angle (e.g., 45°) or over have a total scanning range of less than or equal to 5°. The angles $\alpha_1$ and $\alpha_2$ and a difference between the angles $\alpha_1$ and $\alpha_2$ may be referred to as dithering angles and/or angles defining changes in the projected direction of the expanded beam 124 from the switching SLM 116 to the LCoS SLM 118. Although three vectors are shown, the expanded beam 124 may be dithered between any number of angles in any predetermined and/or selected pattern.

The switching SLM 116 may be implemented as an array of fast-switching spatial light modulators that each have a response time of less than 1 milli-second (ms). As a first example, the array of fast-switching spatial light modulators may include digital light processing (DLP) microelectromechanical systems (MEMS) mirrors. One of the device drivers 140 controls tilt angles of the DLP MEMS mirrors. The angles are based on the input driving voltages provided by the one of the device drivers 140 and alter the incident angles of the beam provided to the LCoS SLM 118.

As a second example, the switching SLM 116 may be implemented as one or more piston mode SLMs, where mirror heights of the piston mode SLMs are adjusted by respective input driving voltages. The switching SLM 16 may include an array of piston mode SLMs and one of the device drivers 140 of the control module 120 may provide respective input driving voltages. Changing the heights of the mirrors alters the resultant incident angles of the beam provided to the LCoS SLM 118.

As yet another example, the switching SLM 116 may be implemented as one or more ferroelectric liquid crystal SLMs, which are controlled by one of the device drivers 140. The molecular orientation (effective refractive index) of the ferroelectric liquid crystal SLMs are controlled based on an input driving voltages provided by the one of the device drivers 140 to alter the incident angles of the beam provided to the LCoS SLM 118.

The dithered expanded beam 128 is incident on to the LCoS SLM 118. The LCoS SLM 118 receives a control signal from the control module 120, which provides the phase hologram of the graphic to be projected. The diffracted phase hologram beam 130 from LCoS SLM 118 is a multiplication of a tilted wavefront and phase hologram of the graphic to be projected in the frequency domain. The output of the switching SLM 116 is diffracted by the LCoS SLM 118 and forms an image on the retinas of the viewer. At each instance, due to the slightly different incident angle of the expanded light beam 128 onto LCoS SLM 118, the image formed on the retinas shifts slightly. The shifts in the image occur at the rate of dithering. The rate of dithering may be at a frequency greater than 60 Hz, such that (i) the human eye is unable to detect flicker, and (ii) the slightly shifted images and corresponding speckle are averaged by the retinas of the viewer.

The encoded phase hologram beam 130 also has multiple different occurrences, which are at different respective reflected angles. Example reflected wave vectors $\vec{k}_{r,t1}$, $\vec{k}_{r,t2}$, $\vec{k}_{r,t3}$ are shown for three different occurrences and three different angles of reflection. The three different occurrences correspond directly to the dithering performed by the switching SLM 116.

The control module 120 may include one or more display drivers 140. One or more of the display drivers 140 may adjust the angular states and/or mirror heights of the switching SLM 116. Another one or more of the display drivers 140 may be used to control states of the LCoS SLM 118. The display drivers 140 may be implemented at the control module 120 and/or at the switching SLM 116 and/or the LCoS SLM 118.

The LCoS SLM 118 may include a limiting aperture 150 to mitigate stray light. The limiting aperture 150 may be implemented as a frame holding the LCoS SLM 118.

The encoded phase hologram of the LCoS SLM 118 may be represented as P(fx, fy), where fx and fy are coordinates in the frequency domain. The encoded phase hologram beam 130 is outputted from the LCoS SLM 118 at different angles and received at the eyes (one eye 160 is shown) of a viewer. The corneal lenses (one corneal lens 162 is shown) perform an inverse Fourier transform and convert the encoded phase hologram beam 130, represented as $e^{i\vec{k}\cdot\vec{\Delta r}}P(fx, fy)$, to a real image p(x,y) seen via the retinas (one retina 164 is shown) of the viewer.

The dithered expanded beam 128, which is in-phase, may be represented as where i is the imaginary number (or square root of −1), $\vec{k}$ is the incident angle vector and $\vec{\Delta r}$ is an optical path length that a wave propagates from the switching SLM 116 to the LCoS SLM 118.

The inverse Fourier transform performed by the eye 160 may be represented by equation 1.

$$p(x, y) = F^{-1}\left\{e^{i\vec{k}\cdot\vec{\Delta r}}P(fx, fy)\right\} \qquad (1)$$

As an example, equation 1 may be modified to represent the inverse Fourier transform for each of the three different encoded phase hologram beams 130 out of the LCoS SLM 118 for the three different times t1, t2, t3. Equations 2-4 provide example representations of these beams.

$$p(x, y) = F^{-1}\left\{e^{i\vec{k}_{in,t1}\cdot\vec{\Delta r}}P(fx, fy)\right\} \qquad (2)$$

$$p_2(x, y) = F^{-1}\left\{e^{i\vec{k}_{in,t2}\cdot\vec{\Delta r}}P(fx, fy)\right\} = F^{-1}\left\{e^{i(\vec{k}_{in,t1}\cdot\vec{\Delta k})\cdot\vec{\Delta r}}P(fx, fy)\right\} \qquad (3)$$

$$p_3(x, y) = F^{-1}\left\{e^{i\vec{k}_{in,t3}\cdot\vec{\Delta r}}P(fx, fy)\right\} = F^{-1}\left\{e^{i(\vec{k}_{in,t1}-\vec{\Delta k})\cdot\vec{\Delta r}}P(fx, fy)\right\} \qquad (4)$$

Equations 3-4 provide t1 equivalent representations showing $\pm\Delta\vec{k}$ (or change in the incident angle vector $\vec{k}$). The conversions from t2 and t3 to t1 are represented by equations 5-6, which include wave vectors at different times.

$$\vec{k}_{in,t2} = \vec{k}_{in,t1} + \vec{\Delta k} \qquad (5)$$

$$\vec{k}_{in,t3} = \vec{k}_{in,t1} - \vec{\Delta k} \qquad (6)$$

Based on the shift theorem of Fourier transform described in equation 7 and equation 8, a tilt in the wave vector k in frequency domain induces the a shift in the projected graphic.

$$g(x,y) = F^{-1}\{G(fx,fy)\} \qquad (7)$$

$$g(x-a, y-b) = F^{-1}\{e^{-i\pi(fxa+fxb)}G(fx,fy)\} \qquad (8)$$

The above-described tilting provided by the switching SLM 116 tilts the wavefront, which induces a shift in the real image p(x,y) formed on the retina. The retina averages the received images, which reduces and/or removes speckle and/or blurring and provides a single image free of speckle and/or blurred areas.

Figure 2:
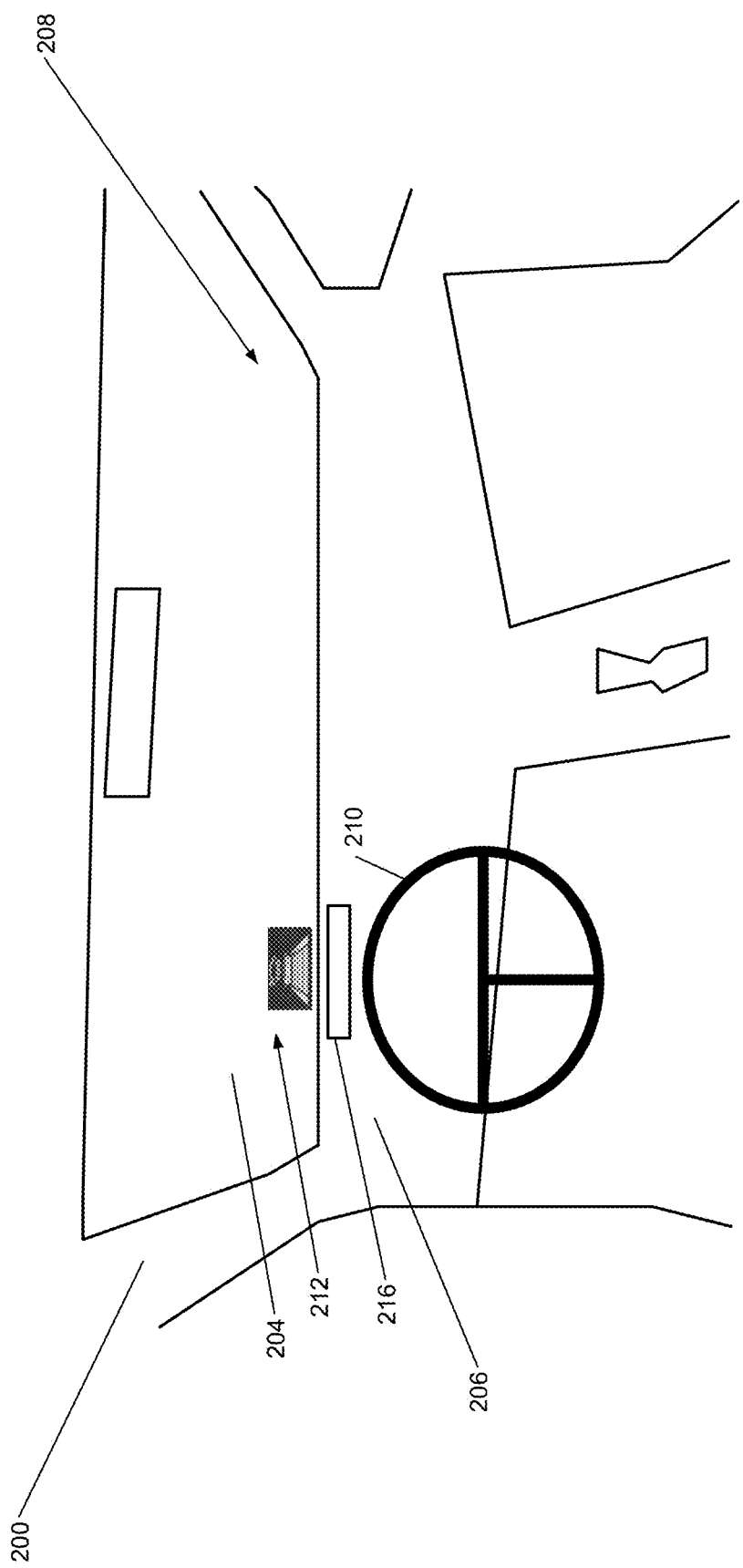
FIG. 2 is a perspective view of an example interior of a vehicle including a HUD.

FIG. 2 shows an example perspective view from a driver seat of a vehicle 200. The vehicle 200 includes a windshield 204 located in a front opening of the vehicle 200. Passengers within a passenger cabin 208 of the vehicle 200 can look through the windshield 204 to see in front of the vehicle 200. While the example of a land-based vehicle is described, the present application is also applicable to air-based vehicles (e.g., airplanes, helicopters, etc.) and water-based vehicles (e.g., boats, etc.). Also, although some examples are disclosed herein with respect to vehicle implementations, the examples are applicable to non-vehicle implementations.

As shown in FIG. 2, the windshield 204 is visually located above a dashboard 206 of the vehicle 200. The vehicle 200 may include a steering wheel 210. The vehicle 200 may be an autonomous vehicle, a semi-autonomous vehicle, or a non-autonomous vehicle.

Figure 3:
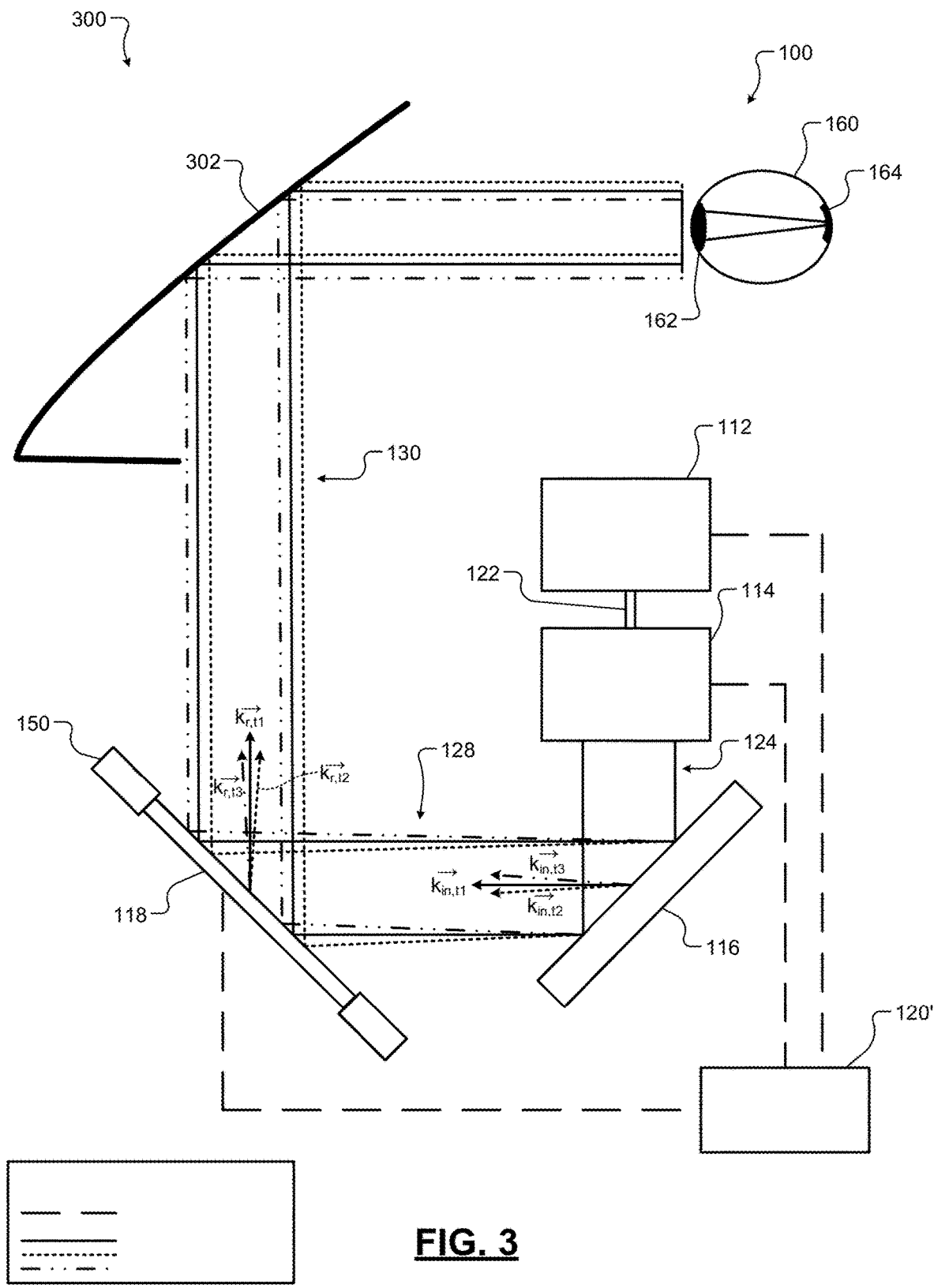
FIG. 3 is a functional block diagram of an example implementation of the direct-retina holographic projection system of FIG. 1.

A HUD system 300, such as that shown in FIG. 3, projects a hologram 212 shown in FIG. 2 onto a portion of the windshield 204 through an aperture 216 in the dashboard 204. The hologram 212 includes various vehicle information, such as a present speed of the vehicle 200, a present gear of a transmission of the vehicle 200, an engine speed, a directional heading of the vehicle 200, present infotainment system settings, and/or other vehicle information. The hologram 212 presents data to the driver of the vehicle without the driver having to look away from objects in front of the vehicle. As discussed further below, the hologram 212 includes replicated instances of one hologram as provided by the dithering disclosed herein.

FIG. 3 shows a HUD system 300 that includes a reflector 302 of a vehicle and the direct-retina holographic projection system 100 of FIG. 1 with a modified version of the control module 120 (identified as control module 120'). In the example shown, the reflector is implemented as a windshield, but may be a different reflector. The control module 120 may perform the operations described above and additional operations, such as determining vehicle information to display via the reflector (or windshield 302). The direct-retina holographic projection system 100 includes one or more light sources (one laser 112 is shown), the beam expander 114, the switching SLM 116, the LCoS SLM 118 and the control module 120'. The laser 112 generates a laser beam 122, which is received at the beam expander 114. The beam expander 114 expands a width of the laser beam 122 to provide an expanded beam 124.

The switching SLM 116 receives the expanded beam 124 and iteratively changes an incident angle of the expanded beam 124 reflected at the LCoS SLM 118 to provide a dithered expanded beam 128 including multiple instances of the expanded beam 124. The control module 120' switches angular states and/or mirror heights of the switching SLM 116 to change the incident angle of the expanded beam 124 at a high-frequency (e.g., greater than or equal to 60 Hz). The dithered expanded beam 128 is dithered to provide multiple beams at respective incident angles.

Example incident vectors $\vec{k}_{in,t1}$, $\vec{k}_{in,t2}$, $\vec{k}_{in,t3}$ for three different occurrences of the same beam (or three beams) at three different times are shown to illustrate changes in the incident angle of the expanded beam 124. The switching SLM 116 may be configured and controlled as described above.

The LCoS SLM 118 receives the dithered expanded beam 128 and based on a control signal from the control module 120' encodes and converts the dithered expanded beam 128 to provide an encoded phase hologram beam 130. The encoded phase hologram beam 130 also has multiple different occurrences (or instances), which are at different respective reflected angles. Example reflected vectors $\vec{k}_{r,t1}$, $\vec{k}_{r,t2}$, $\vec{k}_{r,t3}$ are shown for three different occurrences and three different angles of reflection. The three different occurrences correspond directly to the dithering performed by the switching SLM 116.

The control module 120' may include one or more display drivers 140. One or more of the display drivers 140 may adjust the angular states and/or mirror heights of the switching SLM 116. Another one or more of the display drivers 140 may be used to control states of the LCoS SLM 118. The display drivers 140 may be implemented at the control module 120' and/or at the switching SLM 116 and/or the LCoS SLM 118.

The LCoS SLM 118 may include a limiting aperture 150 to mitigate stray light. The limiting aperture 150 may be implemented as a frame holding the LCoS SLM 118.

Figure 4:
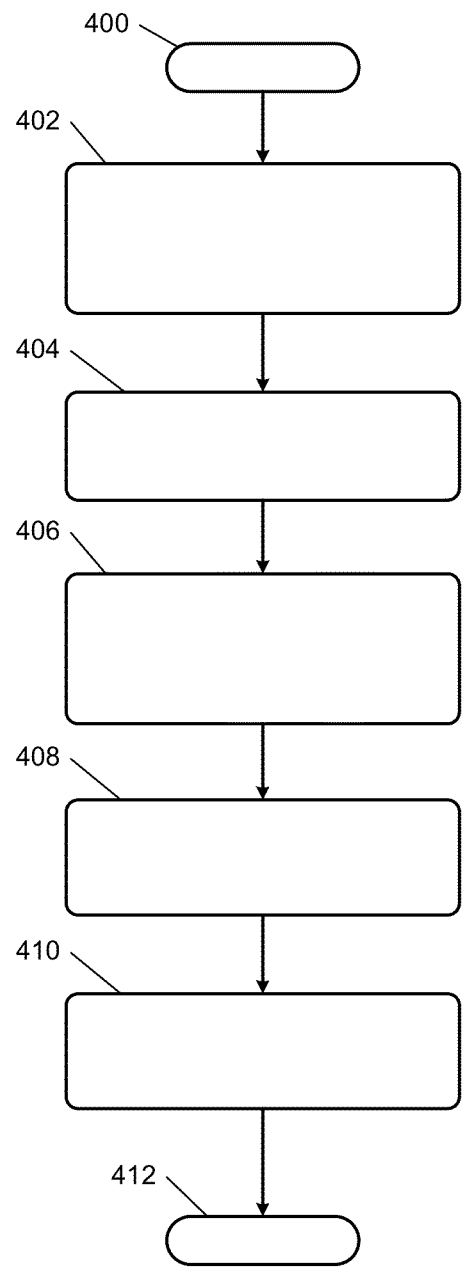
FIG. 4 illustrates an example direct-retina holographic projection method in accordance with the present disclosure.

FIG. 4 shows a direct-retina holographic projection method which may be implemented by the direct-retina holographic projection system 100 and the control module 120' of FIG. 3. Although the following operations are primarily described with respect to the implementation of FIG. 3, the operations may be easily modified to apply to other implementations of the present disclosure. The operations may be iteratively performed.

The method may begin at 400. At 402, the control module 120' determines dithering angles and a switching (or dithering) frequency for switching between the angles. This may include determining a switching pattern and/or order of dithering angles, determining mirror tilt angles, and/or determining heights of one or more piston mode spatial light modulators. The dithering angles and/or other corresponding information may be determined based on (i) a predetermined distance between the switching SLM 116 and the LCoS SLM 118, (ii) a predetermined distance between the LCoS SLM 118 and the reflector 302, and/or (iii) a predetermined estimate of a distance between the reflector 302 and the eyes of a viewer. The other corresponding information may be directly related to the dithering angles and include tilt angles of the beam output from the switching SLM 116, mirror tilt angles, heights of piston mode spatial light modulators, etc. The dithering angles are determined to prevent shifted instances of the image projected from being resolved by the viewer. When the instances of the projected image is resolved, the viewer sees a speckled and/or blurred image.

Figure 5:
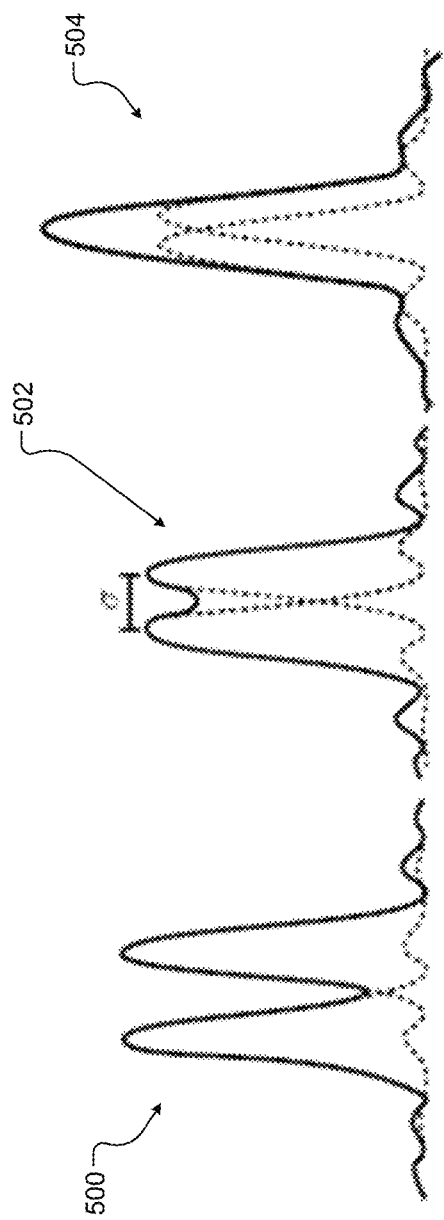
FIG. 5 is a diagram including example resolved, semi-resolved and unresolved plots.

FIG. 5 shows a diagram including an example resolved plot 500, an example semi-resolved plot 502 and an example unresolved plot 504. A Rayleigh Criterion value a is shown and is directly related to the selected dithering angles of the switching SLM 116. The Rayleigh Criterion value a is a distance between peaks of plotted intensity signals. The intensity signals may refer to different instances of the same image. The larger the dithering angle, the larger the Rayleigh Criterion value a and the more resolved the images are to a viewer. The smaller the dithering angle, the smaller the Rayleigh Criterion value a and the more unresolved the images are to the viewer. The control module 120' determines the dithering angles and/or other related information to be in appropriate ranges such that the instances of an image are unresolved. For example, the control module 120' may select the tilt and/or dithering angle of the switching SLM 116 to be less than a predetermined angle. As the tilt and/or dithering angle increases above the predetermined angle, the instances of an image become semi-resolved.

Referring to FIG. 4, at 404, the control module 120' activates the laser 112 to generate the laser beam 122. The laser beam 122 is directed to the beam expander 114, which expands the laser beam 122 to provide the expanded laser beam 124 that is provided to the switching SLM 116.

At 406, the control module 120' controls the dithering of the switching SLM 116. The dithering is achieved by fast switching the switching SLM 116 to direct the expanded laser beam 124 to slightly different incident angles on SLM 118. This may include generating, via one or more of the device drivers 140, driving voltages based on the determined dithering angles and the selected switching (or dithering) frequency to alter the tilt angles of the switching SLM 116, the tilt angles of the mirrors of the switching SLM 116, the heights of the piston mode spatial light modulator(s), etc. The dithering and switching (or scanning) angle is set such that the dithering of a spot formed on retinas of the viewer is unresolvable. The switching SLM 116 may dither light from a collimated light source, such as the laser 112 and the beam expander 114, and induce multiple illumination incidence angles onto the LCoS SLM 118 during display of each image frame.

At 408, the control module 120' controls operation of the LCoS SLM 118 to display the phase hologram of graphic to be projected. The LCoS SLM 118, with phase hologram of graphic, is illuminated with dithered expanded laser beam 124 and generates the encoded phase hologram beam 130. The encoded phase hologram beam 130 includes instances of the same phase hologram at different angles as shown in FIG. 3. This may include controlling one or more of the device drivers 140 to generate driving voltages to control states of the LCoS SLM 118.

At 410, instances of the encoded phase hologram may be directed at the eyes of the viewer via the reflector 302. The reflected holograms with slight different incident angles form slightly shifted images. The speckle of the images are slightly shifted and averaged by the retinas of the viewer, such that the viewer sees a reduced amount of speckle or does not see any speckle.

The phase holograms may be generated based on signals from a vehicle control module. The control module 120' may be implemented as a vehicle control module or may be in communication with a vehicle control module. The control module 120' generates the phase holograms based on vehicle data. The control module 120' may obtain the vehicle data, for example, from a communication bus of the vehicle. The vehicle data may include, for example, the present speed of the vehicle, the present gear of the transmission of the vehicle, the present engine speed, the present directional heading of the vehicle, the present infotainment system settings, and/or the other vehicle information. The method may end at 412.

Figure 6:
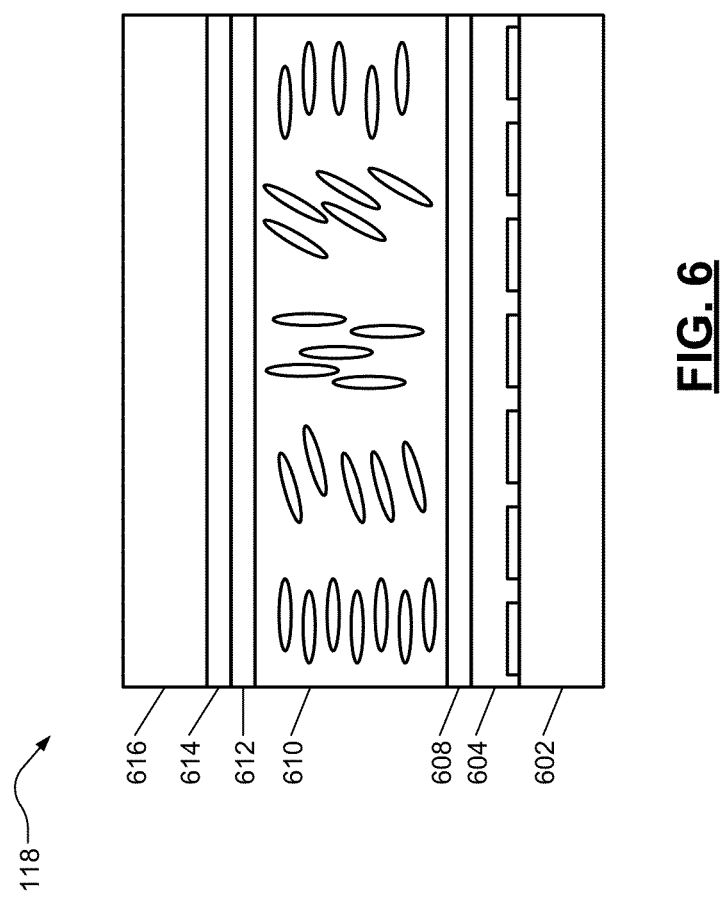
FIG. 6 is a cross-sectional view of an example of a liquid crystal on silicon (LCoS) spatial light modulator (SLM) in accordance with the present disclosure.

FIG. 6 shows an example of the LCoS SLM 118 of FIGS. 1 and 3. The LCoS SLM 118 may be used in any of the embodiments disclosed herein. The LCoS SLM 118 may include a silicon backplane layer 602; a LCoS SLM (or phase modulator) layer including a circuit (or pixelized electrode) layer 604, a first alignment layer 608, a liquid crystal layer 610, a second alignment layer 612, and a transparent electrode layer 614; and a glass substrate layer 616.

The circuit layer 604 includes control circuitry and/or pixel drivers for controlling the liquid crystal layer 610. The circuit layer 604 may include a transistor for each pixel. Each pixel independently modulates phase of light exiting the LCoS SLM. As an example, if voltages provided to the pixels are different, then phases of light rays out of corresponding portions of the LCoS SLM have different phases. Each of the pixels may have an associated voltage set. The range of the voltages provided to each pixel may vary the phase of the corresponding portion of the phase hologram beam 130 between, for example, 0-2π to advance or delay the corresponding portion of the light wave coming out of the LCoS SLM 118.

The circuit layer 604 controls the amount and phase of light emitted from the liquid crystal layer 610. Orientations of molecules in the liquid crystal layer 610 and associated with the pixels of the LCoS SLM 118 change with voltage. The voltage-dependent orientation of molecules induces spatially varying phase distribution on LCoS SLM 118. The relation between the amount of phase being modulated and applied voltage can be positive related or negative related, depending on the physical property of liquid crystals. The LCoS SLM layer is further described with respect to FIG. 7. The LCoS SLM 118 may include a reflective film layer when implemented as a reflective holographic projector.

Figure 7:
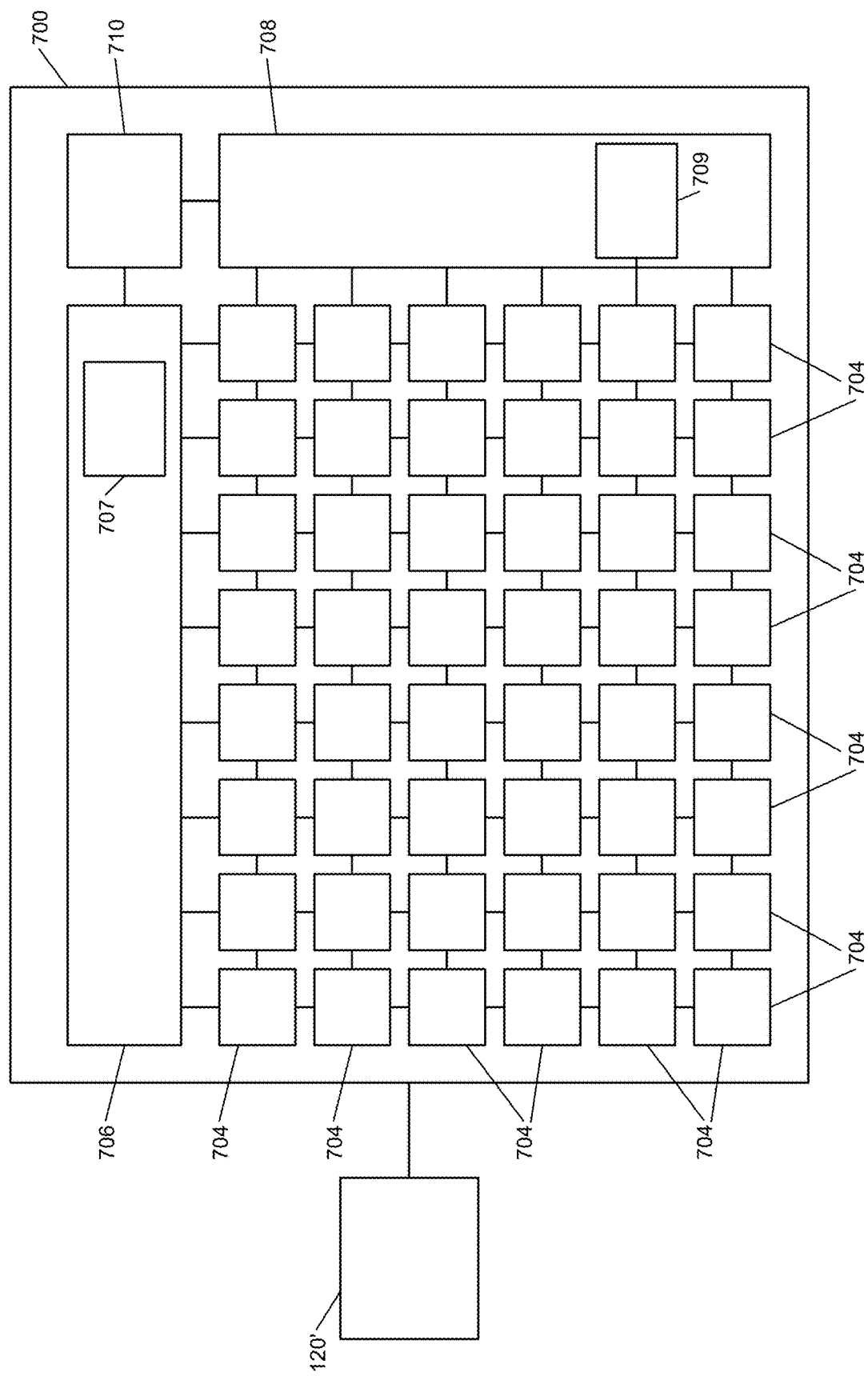
FIG. 7 is a functional block diagram of an example of a portion of a LCoS SLM and a control module in accordance with the present disclosure.

FIG. 7 shows a portion 700 of a LCoS SLM layer and the control module 120', which may be implemented in the embodiments of FIGS. 1 and 3. The LCoS SLM layer may include pixels 704 arranged in an array and connected to drive circuits 706, 708. The LCoS SLM layer may also include a SLM control module 710, which may control the driver circuits 706 and 708. The driver circuits 706, 708 may receive power from the SLM control module 710 or the control module 120' via switches 707, 709. The SLM control module 710 may receive signals directly from wavefront sensors and/or control signals from the control module 120'. The control module 120' may receive phase detection signals and control operation of the SLM control module 710 to adjust voltages provided to the pixels 704. In another embodiment, the SLM control module 710 directly receives the phase detection signals and controls the drive circuits 706, 708 to generate the appropriate voltages, which are applied at the pixels 704.

Figure 8:
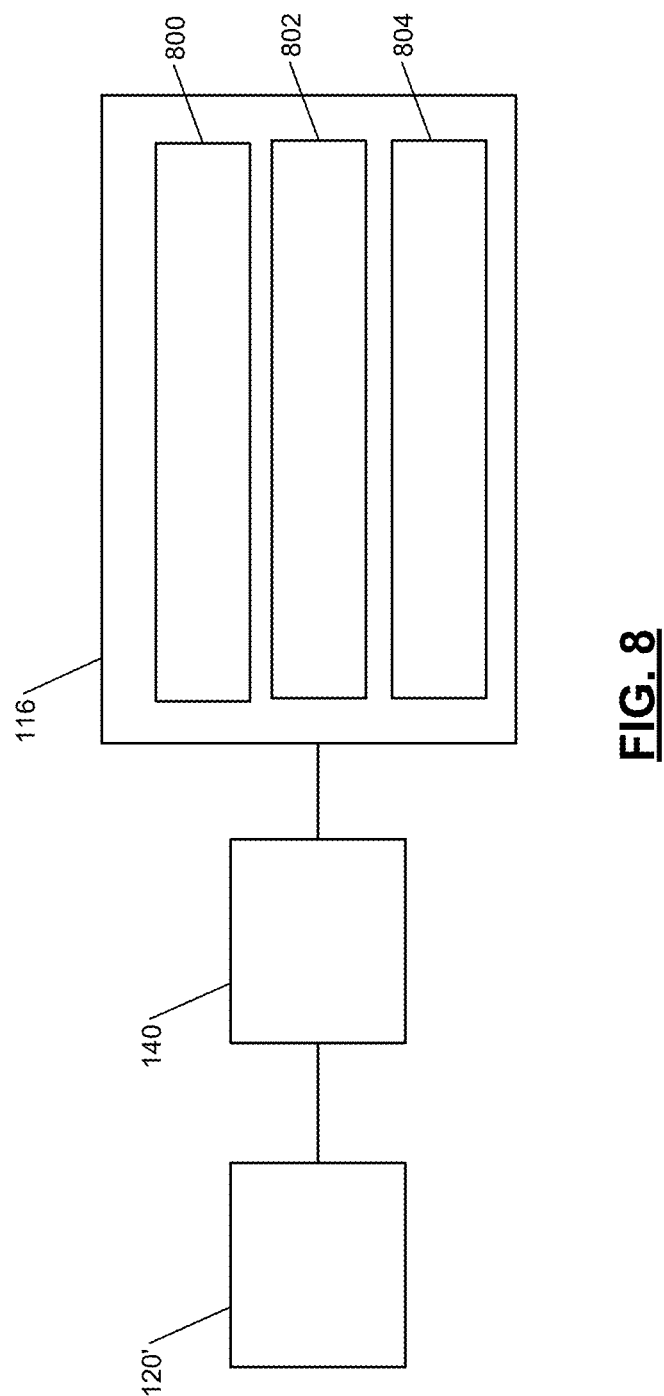
FIG. 8 is a functional block diagram of an example switching SLM and corresponding device driver and control module in accordance with the present disclosure.

FIG. 8 shows the control module 120', one of the device drivers 140, and the switching SLM 116. As described above, the switching SLM 116 may include an array of DLP MEMS mirrors 800, an array of piston mode spatial light modulators 802 and/or one or more ferroelectric liquid crystal spatial light modulators 804. The device driver 140 may be implemented as part of the control module 120' or as part of the switching SLM 116.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

What is claimed is:

1. A direct-retina holographic projection system comprising:
    a first spatial light modulator configured to receive a beam of light from a non-image light source and dither the beam of light at a predetermined frequency to provide a dithered beam of light including a plurality of instances of the beam of light, the dithered beam of light being void of an image;
    a second spatial light modulator configured to receive the plurality of instances of the beam of light from the first spatial light modulator, display an encoded phase hologram of a graphic image to be projected, and diffract the plurality of instances of the beam of light to provide a plurality of instances of the encoded phase hologram with same graphic information as the graphic image but multiplied with a plurality of dithered wavefronts; and
    a control module configured to iteratively adjust a parameter of the first spatial light module to generate the plurality of instances of the beam of light, control operation of the second spatial light modulator to, based on the plurality of instances of the beam of light, display multiple instances of the graphic image on a retina of an eye of a viewer by directing the plurality of instances of the encoded phase hologram of the graphic image toward a reflector or the eye of the viewer, and generate a control signal to control generation of the encoded phase hologram based on the plurality of instances of the beam of light, wherein the second spatial lights modulator is configured to, based on the control signal, encode and convert the dithered beam of light to provide the plurality of instances of the encoded phase hologram with the graphic image.

2. The direct-retina holographic projection system of claim 1, wherein the second spatial light modulator directs the plurality of instances of the encoded phase hologram directly at the eye of the viewer without forming a real image on a diffuser and without reflecting the graphic image with mirrors.

3. The direct-retina holographic projection system of claim 1, wherein the control module is configured to dither the beam of light, via the first spatial light modulator, at a frequency greater than or equal to 60 Hertz.

4. The direct-retina holographic projection system of claim 1, wherein the control module is configured to dither the beam of light between a first angle and a second angle at the predetermined frequency.

5. The direct-retina holographic projection system of claim 4, wherein a difference between the first angle and the second angle is less than or equal to 5°.

6. The direct-retina holographic projection system of claim 4, wherein a difference between the first angle and the second angle is less than or equal to 1°.

7. The direct-retina holographic projection system of claim 1, wherein the first spatial light modulator comprises digital light processing microelectromechanical systems mirrors.

8. The direct-retina holographic projection system of claim 1, wherein the first spatial light modulator comprises a piston mode spatial light modulator.

9. The direct-retina holographic projection system of claim 1, wherein the first spatial light modulator comprises a ferroelectric liquid crystal spatial light modulator.

10. The direct-retina holographic projection system of claim 1, further comprising a device driver, wherein:
    the control module is configured to control the device driver to generate one or more driving voltages; and
    the first spatial light modulator changes a dithering angle based on the driving voltages.

11. A direct-retina holographic projection system comprising:
    a first spatial light modulator configured to receive a beam of light from a light source and dither the beam of light at a predetermined frequency to provide a plurality of instances of the beam of light;
    a second spatial light modulator configured to receive the plurality of instances of the beam of light from the first spatial light modulator, display an encoded phase hologram of a graphic image to be projected, and diffract the plurality of instances of the beam of light to provide a plurality of instances of the encoded phase hologram with same graphic information as the graphic image but multiplied with a plurality of dithered wavefronts, wherein the second spatial light modulator directs the plurality of instances of the encoded phase hologram directly at a reflector to be seen by an eye of a viewer without forming a real image on a diffuser, and wherein the reflector is a windshield of a vehicle; and
    a control module configured to iteratively adjust a parameter of the first spatial light modulator to generate the plurality of instances of the beam of light, generate a control signal based on the plurality of instances of the beam of light, and using the control signal, control operation of the second spatial light modulator to display multiple instances of the graphic image on a retina of the eye of the viewer by directing the plurality of instances of the encoded phase hologram of the graphic image toward the reflector.

12. A method of operating direct-retina holographic projection system, the method comprising:
- receiving a beam of light from a non-image light source at a first spatial light modulator,
- dithering the beam of light at a predetermined frequency to provide a plurality of instances of the beam of light, wherein the dithering comprises iteratively adjusting a parameter of the first spatial light module to generate the plurality of instances of the beam of light
- receiving the plurality of instances of the beam of light al a second spatial light modulator, wherein at least one of (i) the first spatial light modulator is not an image source, or (ii) the second spatial light modulator is an image source;
- converting the plurality of instances of the beam of light to a plurality of instances of an encoded phase hologram;
- generating a control signal based on the plurality of instances of the beam of light, and using the control signal, controlling operation of the second spatial light modulator to display multiple instances of an image on a retina of an eye of a viewer by directing the plurality of instances of the encoded phase hologram toward a reflector or the eye of the viewer.

13. The method of claim 12, further comprising directing the plurality of instances of the encoded phase hologram directly from the second spatial light modulator to the reflector or the eye of the viewer.

14. The method of claim 12, wherein the beam of light is dithered, via the first spatial light modulator, at a frequency greater than or equal to 60 Hertz.

15. The method of claim 12, wherein the beam of light is dithered, via the first spatial light modulator, between a first angle and a second angle at the predetermined frequency.

16. The method of claim 15, wherein a difference between the first angle and the second angle is less than or equal to 5°.

17. The method of claim 15, wherein a difference between the first angle and the second angle is less than or equal to 1°.

18. The method of claim 12, wherein the dithering of the beam of light comprises changing at least one of (i) driving voltages of digital light processing microelectromechanical systems mirrors of the first spatial light modulator, or (ii) a driving voltage of a ferroelectric liquid crystal spatial light modulator of the first spatial light modulator.

19. The method of claim 12, wherein the dithering of the beam of light comprises changing a driving voltage of a piston mode spatial light modulator.

* * * * *